(12) United States Patent
Chaudhry et al.

(10) Patent No.: US 7,169,714 B2
(45) Date of Patent: Jan. 30, 2007

(54) METHOD AND STRUCTURE FOR GRADED GATE OXIDES ON VERTICAL AND NON-PLANAR SURFACES

(75) Inventors: Samir Chaudhry, Weston, FL (US); Pradip K. Roy, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 133 days.

(21) Appl. No.: 10/986,984

(22) Filed: Nov. 12, 2004

(65) Prior Publication Data

US 2005/0164516 A1 Jul. 28, 2005

Related U.S. Application Data

(63) Continuation of application No. 10/179,057, filed on Jun. 25, 2002, now abandoned, which is a continuation-in-part of application No. 09/481,992, filed on Jan. 11, 2000, now Pat. No. 6,541,394.

(51) Int. Cl.
*H01L 21/469* (2006.01)

(52) U.S. Cl. ............... 438/770; 438/438; 438/774; 438/761

(58) Field of Classification Search ............... 438/268, 438/770, 774, 787, 585, 773, 761
See application file for complete search history.

(56) References Cited

U.S. PATENT DOCUMENTS 4,277,320 A   7/1981   Beguwala et al.
4,518,630 A   5/1985   Grasser
4,826,779 A   5/1989   Wright et al.

(Continued)

FOREIGN PATENT DOCUMENTS

EP    0 301 460    2/1989

(Continued)

OTHER PUBLICATIONS

Ponomarev et al.; High-Performance Deep SubMicron CMOS Technologies with Polycrystalline-SiGe Gates; IEEE Transactions on Electron Devices, vol. 47, No. 4; Apr. 2000; pp. 848.

(Continued)

*Primary Examiner*—Michael Trinh

(57) ABSTRACT

A method for forming an oxide layer on a vertical, non-planar semiconductor surface provides a low stress oxide layer having a pristine interface characterized by a roughness of less than 3 angstroms. The oxide layer includes a portion that is substantially amorphous and notably dense. The oxide layer is a graded growth oxide layer including a composite of a first oxide portion formed at a relatively low temperature below the viscoelastic temperature of the oxide film and a second oxide portion formed at a relatively high temperature above the viscoelastic temperature of the oxide film. The process for forming the oxide layer includes thermally oxidizing at a first temperature below the viscoelastic temperature of the film, and slowly ramping up the temperature to a second temperature above the viscoelastic temperature of the film and heating at the second temperature. After the second, high temperature oxidation above the viscoelastic temperature, the structure is then slowly cooled under gradual, modulated cooling conditions.

19 Claims, 6 Drawing Sheets

U.S. PATENT DOCUMENTS

| | | | |
|---|---|---|---|
| 4,851,370 A | 7/1989 | Doklan et al. | |
| 4,931,409 A * | 6/1990 | Nakajima et al. | 438/430 |
| 5,016,081 A | 5/1991 | Brown et al. | |
| 5,077,691 A | 12/1991 | Haddad et al. | |
| 5,089,441 A | 2/1992 | Moslehi | |
| 5,153,701 A | 10/1992 | Roy | |
| 5,210,056 A * | 5/1993 | Pong et al. | 438/773 |
| 5,334,556 A | 8/1994 | Guldi | |
| 5,371,394 A | 12/1994 | Ma et al. | |
| 5,464,783 A | 11/1995 | Kim et al. | |
| 5,514,608 A | 5/1996 | Williams et al. | |
| 5,567,638 A | 10/1996 | Lin et al. | |
| 5,598,369 A | 1/1997 | Chen et al. | |
| 5,619,052 A | 4/1997 | Chang et al. | |
| 5,622,607 A | 4/1997 | Yamazaki et al. | |
| 5,629,221 A | 5/1997 | Chao et al. | |
| 5,707,888 A | 1/1998 | Aronowitz et al. | |
| 5,739,580 A | 4/1998 | Aronowitz et al. | |
| 5,757,204 A | 5/1998 | Nayak et al. | |
| 5,814,562 A | 9/1998 | Green et al. | |
| 5,817,581 A | 10/1998 | Bayer et al. | |
| 5,821,158 A | 10/1998 | Shishiguchi | |
| 5,851,892 A | 12/1998 | Lojek et al. | |
| 5,863,831 A | 1/1999 | Ling et al. | |
| 5,867,425 A | 2/1999 | Wong | |
| 5,869,405 A | 2/1999 | Gonzalez et al. | |
| 5,877,057 A | 3/1999 | Gardner et al. | |
| 5,885,870 A | 3/1999 | Maiti et al. | |
| 5,891,809 A | 4/1999 | Chau et al. | |
| 5,913,149 A | 6/1999 | Thakur et al. | |
| 5,918,137 A | 6/1999 | Ng et al. | |
| 5,926,741 A | 7/1999 | Matsuoka et al. | |
| 5,940,736 A * | 8/1999 | Brady et al. | 438/787 |
| 5,968,279 A | 10/1999 | MacLeish et al. | |
| 5,972,804 A | 10/1999 | Tobin et al. | |
| 6,008,128 A | 12/1999 | Habuka et al. | |
| 6,020,247 A | 2/2000 | Wilk et al. | |
| 6,025,280 A | 2/2000 | Brady et al. | |
| 6,027,975 A | 2/2000 | Hergenrother et al. | |
| 6,029,680 A | 2/2000 | Hawthorne et al. | |
| 6,069,062 A | 5/2000 | Downey | |
| 6,083,815 A | 7/2000 | Tsai et al. | |
| 6,083,836 A | 7/2000 | Rodder | |
| 6,180,454 B1 | 1/2001 | Chang et al. | |
| 6,197,641 B1 | 3/2001 | Hergenrother et al. | |
| 6,207,591 B1 | 3/2001 | Aoki et al. | |
| 6,210,999 B1 | 4/2001 | Gardner et al. | |
| 6,222,233 B1 | 4/2001 | D'Anna | |
| 6,281,140 B1 | 8/2001 | Chen et al. | |
| 6,281,559 B1 | 8/2001 | Yu et al. | |
| 6,316,300 B1 | 11/2001 | Ozeki et al. | |
| 6,492,712 B1 | 12/2002 | Chen et al. | |
| 6,541,394 B1 | 4/2003 | Chen et al. | |

FOREIGN PATENT DOCUMENTS

| | | |
|---|---|---|
| EP | 0 323 071 | 7/1989 |
| GB | 2 056 174 | 3/1981 |
| GB | 2 347 265 | 8/2000 |
| JP | 62 079 628 | 4/1987 |
| JP | 01 204435 | 8/1989 |
| WO | WO 96/33510 | 10/1996 |

OTHER PUBLICATIONS

Lee et al.; Enhancement of PMOS Device Performance with Poly-SiGe Gate; Electron Device Letters, vol. 20, No. 5; May 1999; pp. 232-234.

Song et al.; Ultra Thin (<20) CVD Si3N4 Gate Dielectric for Song et al.; Ultra Thin (<20) CVD Si3N4 Gate Dielectric for Deep-Sub-Micron CMOS Devices; Microelectronics Research Center, The University of Texas, Austin; 4 pgs.

Hattangady et al.; Ultrathin nitrogen-profile engineered gate dielectric films; Semiconductor Process and Device Center, Texas Instruments; 4 pgs.

Tseng et al.; Reduced Gate Leakage Current and Boron Penetration of 0.18 m 1.5 V MOSFETs using Integrated RTCVD Oxynitride Gate Dielectric; 4 pgs.

Hattangady et al.; Remote Plasma Nitrided Oxides for Ultrathin Gate Dielectric Applications; SPIE 1998 Symp. Microelec. Manf.; Sep. 1998; Santa Clara, CA; pp. 1-11.

Wu et al.; Improvement of Gate Dielectric Reliability for p+ Poly MOS Devices Using Remote PECVD Top Nitride Deposition on Thin Gate Oxides; IEEE 98 36th Annual International Reliability Physics Symposium; Reno, Nevada; 1998; pp. 70-75.

Chatterjee et al.; Sub-100nm Gate Length Metal Gate NMOS Transistors Fabricated by a Replacement Gate Process; Semiconductor Process and Device Center, Texas Instruments; 1997 IEEE; 4pgs.

Kraft et al.; Surface nitridation of silicon dioxide with a high density with nitrogen plasma; J. Vac. Scl. Technol. B, vol. 15, No. 4; 1997 American Vacuum Society; Jul./Aug. 1997; pp. 967-970.

Jeon et al.; Low Temperature of SiO2 Films With Low Interface Trap Density Using ECR Diffusion and ECR CVD Methods; 1996 Conference on Optoelectronic and Microelectronic Materials and Devices Proceedings, Canberra, ACT, Australia, 8-11 Dec. 1996; pp. 259-262.

Rau et al.; Characterization of stacked gate oxides by electron holography; Appl. Phys. Lett., vol. 68, No. 24; 1996 American Institute of Physics; Jun. 10, 1996; pp. 3410-3412.

Ghandhi; VLSI Fabrication Principles—Silicon and Gallium Arsenide; Second Edition; John Wiley & Sons, Inc.; 1994; p. 453.

Cramer et al.; Sodium passivation dependence on phosphorous concentration in tetraethylorthosilicate plasma-enhanced chemical vapor deposited phosphosilicate glasses; J. Appli. Phys. vol. 73, No. 5; 1993 American Institute of Physics; Mar. 1, 1993; pp. 2458-2461.

Wolf; Silicon Processing For The VLSI Era; vol. 2: Process Integration; Lattice Press, Sunset Beach, California; 1990; pp. 354-361.

Wolf; Silicon Processing For The VLSI Era; vol. 1: Process Technology; Lattice Press, Sunset Beach, California; 1986; pp. 5.

* cited by examiner

METHOD AND STRUCTURE FOR GRADED GATE OXIDES ON VERTICAL AND NON-PLANAR SURFACES

This application is a continuation of U.S. patent application Ser. No. 10/179,057, entitled "METHOD AND STRUCTURE FOR GRADED GATE OXIDES ON VERTICAL AND NON-PLANAR SURFACES", filed on Jun. 25, 2002 now abandoned, which is a continuation-in-part of Ser. No. 09/481,992 now U.S. Pat. No. 6,541,394, entitled "METHOD OF MAKING A GRADED GROWN, HIGH QUALITY OXIDE LAYER FOR A SEMICONDUCTOR DEVICE", filed on Jan. 11, 2000, which is commonly assigned with the present invention and is incorporated herein by reference as if reproduced herein in its entirety.

FIELD OF THE INVENTION

The present invention is related, most generally, to semiconductor devices and methods for forming the same. More particularly, the present invention is directed to forming oxide films on vertical, non-planar semiconductor surfaces.

BACKGROUND OF THE INVENTION

In integrated circuits, there is a trend toward a higher device density to increase the number of devices per unit area. Device density is increased by making individual devices smaller and placing the devices closer together. Device dimensions (termed feature size or design rules) have decreased well into the sub-micron regime and continue to become smaller. There is a challenge in today's semiconductor manufacturing industry to continue to decrease feature sizes and also to decrease the distance between devices in a commensurate fashion.

Currently, the majority of MOS (metal oxide semiconductor) transistors have a planar configuration, with the direction of current flow parallel to the plane of the substrate surface on which the transistor is formed. Although there is a need to decrease the size of these devices to achieve increased device density, fabricating these small devices becomes increasingly difficult. In particular, lithography becomes extremely difficult as device dimensions decrease to less than the wavelength of the radiation used to delineate an image of a pattern in radiation-sensitive materials such as photoresists commonly used in the industry.

Vertical device structures have been developed of late, and continue to be developed as alternatives to the more space-consuming planar device configuration. Such devices include a transistor having a channel that is orthogonal to the surface on which it is formed. Such a device is called a vertical transistor because the length of the channel is orthogonal to the substrate surface and includes source/drain regions offset vertically from each other. The transistor gate may surround the channel. Vertical transistor configurations and methods for forming the same are described in U.S. Pat. No. 6,027,975, "Process for Fabricating Vertical Transistors", and in U.S. Pat. No. 6,197,641, "Process for Fabricating Vertical Transistors", the contents of each of which are hereby incorporated by reference for all purposes as if set forth in their entirety.

Although vertical MOSFETs (metal oxide semiconductor field effect transistors) can be packed more densely than planar MOSFETs, the processing issues for the vertical transistors are not trivial. Processes that make it easier and more efficient to fabricate vertical transistors, and processes that produce superior and high-quality transistors, are therefore desired.

Vertical transistors typically have vertical channels that include non-planar surfaces, convex corners, or both. It is therefore especially critical to form high-quality gate oxides on these transistor channels since oxide films formed on curved surfaces and surfaces with convex corners are particularly susceptible to stress-related defects and even dislocations. Growth induced stress typically leads to defects, especially in the interfacial region between the oxide film and the substrate surface on which the oxide film is being formed. Among other problems, this may result in undesirable mass transport paths and leakage currents. Stated generally then, such non-planar surfaces are more prone to higher defect densities and interface trap densities. It is therefore desirable to form high-quality oxide films on non-planar surfaces in general, and particularly on vertical transistor channels which typically include curved surfaces, convex corners, or both.

SUMMARY OF THE INVENTION

The present invention provides a semiconductor product, including a non-planar vertical surface that includes an oxide layer formed on the surface and forming an interface with the surface. The interface between the oxide layer and the surface is characterized by a roughness no greater than three angstroms. In one embodiment, at least a portion of the oxide layer is amorphous in nature.

Another aspect of the present invention is a method for forming an oxide layer on a vertical surface. The method includes thermally oxidizing a vertical semiconductor surface to form a first oxide film on the vertical semiconductor surface at a temperature below the viscoelastic temperature of the oxide film. The method then provides for forming a second oxide film on the vertical semiconductor surface by a further thermal oxidation process which occurs at a temperature above the viscoelastic temperature.

According to another exemplary embodiment, the present invention provides a method for forming an oxide layer on a non-planar semiconductor surface, the method including thermally oxidizing the non-planar semiconductor surface, thereby forming an oxide film, at a temperature below the viscoelastic temperature of the oxide film. The method further provides further thermally oxidizing the non-planar semiconductor surface to form a second oxide film at a temperature above the viscoelastic temperature.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures.

Like numerals denote like features throughout the specification and drawing.

DETAILED DESCRIPTION OF THE INVENTION

Figure 1:
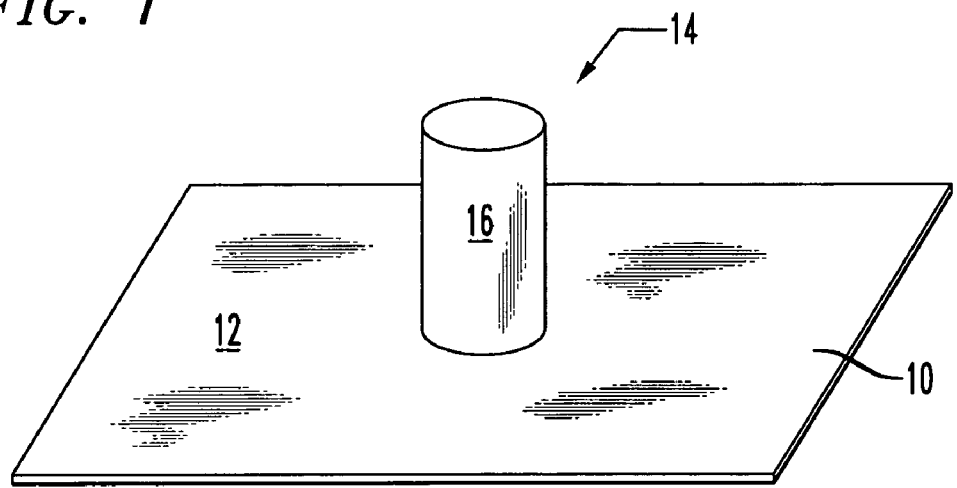
FIG. 1 is a perspective view of a vertical semiconductor surface formed over a horizontal substrate.

The present invention is directed to forming a high-quality oxide layer with a pristine interface on vertical and/or non-planar semiconductor surfaces. More particularly, the present invention is directed to forming such an oxide layer on a vertical semiconductor surface having a curved section, at least one convex corner, or both. In one embodiment, the vertical surface may include a curved section, a flat section, and a junction therebetween. The oxide layer is a high-quality graded growth oxide layer suitable for sub-0.2 micron technologies. The oxide layer may be a composite film formed of an outer oxide film formed at a relatively low temperature and an inner oxide film formed at a relatively high temperature and cooled under gradual, modulated cooling conditions and may therefore be referred to as a graded growth oxide, and, when used as a transistor gate oxide, a graded growth gate, $G^3$.

The graded growth oxide layer is particularly suited to be a gate dielectric for a vertical transistor formed, for example, according to previously-incorporated U.S. Pat. Nos. 6,027,975 and 6,197,641. Vertical transistors operate at high speeds and include reduced feature sizes. It is therefore important for these transistor devices to include high quality gate oxides and channels. The reliability of vertical and other devices is characterized by a few conventional criteria. Device reliability problems include the dielectric breakdown of the gate oxide, the drift of threshold voltage, saturation current and transconductance to unacceptable values. Device reliability problems can be avoided or at least minimized by providing a high quality gate oxide layer.

In order to address the reliability issues discussed above, a variety of approaches have been tried. It is known that the best oxides for many integrated circuit devices are grown rather than deposited oxides. Furthermore, higher growth temperatures generally yield better quality oxides. Unfortunately, there are problems associated with fabricating oxides at high temperatures using conventional techniques. For example, at high temperatures, the thickness of the oxide film is more difficult to control as film growth is especially sensitive to time, at high film growth rates. As a result, the oxide may be too thick for a reduced dimension device. Thus, in the effort to fabricate a better quality oxide, device scaling objectives may be defeated. Moreover, when cooling down from the high growth temperatures, the viscosity of the grown oxide increases and undesired growth-induced stress may result. Such stress induced problems are particularly problematic when the thermally formed oxide film is grown on a non-planar surface, such as a curved surface or a surface that includes convex corners, such as used in vertical transistors. Such surfaces are more prone to stress-related defects. Given these issues, it is customary in the semiconductor industry to grow oxides at low temperatures. The drawback to this practice is that, at low growth temperatures, the oxide quality may be compromised. This reduction in quality adversely impacts reliability of the oxide for reasons discussed above. An aspect of the present invention is to provide a high-quality oxide having low stress. The thermally formed oxide layer of the present invention includes two distinctly formed films—one formed at a relatively high temperature and one formed at a relatively low temperature, and the oxide layer is cooled in a gradual and modulated manner. The oxide layer is characterized by a pristine, relatively smooth interface that it forms with the substrate surface on which it is grown. At least part of the oxide layer may be amorphous in nature and the oxide layer with low stress defects includes a low defect density and a low interface trap density.

The oxide layer of the present invention may be formed on a variety of non-planar surfaces that are conventionally susceptible to stress induced defects. In an exemplary embodiment, the non-planar surfaces may be the vertical surfaces which form the channels of vertical transistors.

FIG. 1 is a perspective view showing semiconductor structure 14 formed over substrate 10. Substrate 10 may be a silicon wafer, a gallium arsenide wafer, a silicon on insulator (SOI) substrate or other suitable substrates used in the semiconductor manufacturing industry. Substrate 10 is oriented generally horizontally and includes horizontal substrate surface 12. Semiconductor structure 14 includes substantially vertical surface 16. Vertical surface 16 is generally orthogonal to substrate surface 12. Semiconductor structure 14 is generally cylindrical in the illustrated embodiment but such structure is intended to be exemplary only. In the illustrated embodiment, vertical surface 16 is generally curved with respect to a plane formed parallel to semiconductor substrate 12. Semiconductor structure 14 and vertical surface 16 may be formed of polycrystalline or amorphous silicon, silicon/germanium, silicon/germanium/carbon, or other suitable semiconductor materials.

Figure 2:
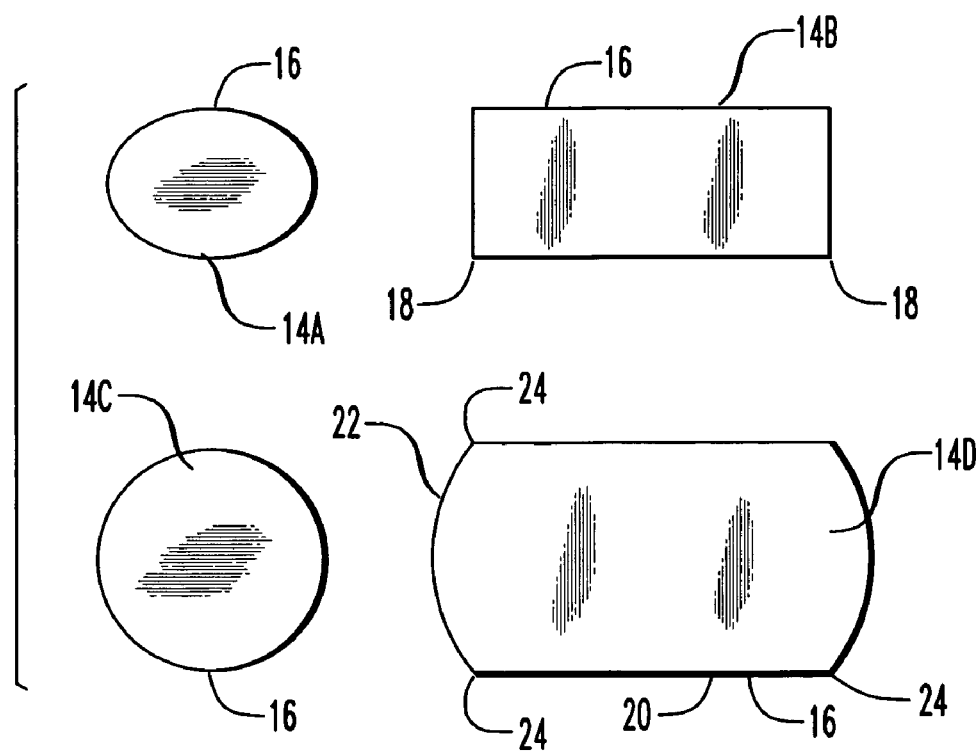
FIG. 2 shows various horizontal cross-sectional configurations of structures that include vertical surfaces.

FIG. 2 shows Various exemplary top or horizontal cross-sectional views of exemplary semiconductor structures that include vertical surfaces. The cross-sectional views are considered to be taken through a plane parallel to the substrate surface over which the semiconductor structure is formed. Semiconductor structure 14A is generally elliptical and includes elliptical vertical surface 16. Semiconductor structure 14B is generally rectangular and includes four opposed parallel sides which form vertical surfaces 16. Semiconductor structure 14B also includes a plurality of convex corners 18. Semiconductor structure 14C is generally round and therefore includes circular vertical surface 16. Semiconductor structure 14D includes vertical surface 16 formed on an opposed set of generally planar surfaces 20 and an opposed set of curved surfaces 22. Convex corners 24 form the junctions between generally planar surfaces 20 and curved surfaces 22. The illustrated embodiments of semiconductor structures 14, 14A, 14B, 14C and 14D are intended to be exemplary only. In other exemplary embodiments, the semiconductor structure formed to include a vertical surface over a generally horizontal substrate may take on various other shapes. In some embodiments, semiconductor structures 14 may be considered plugs or pillars that are formed over the horizontal substrate surface. Previously cited U.S. Pat. Nos. 6,027,975 and 6,197,641 each describe methods for forming vertical surfaces on such semiconductor structures.

Figure 3A:
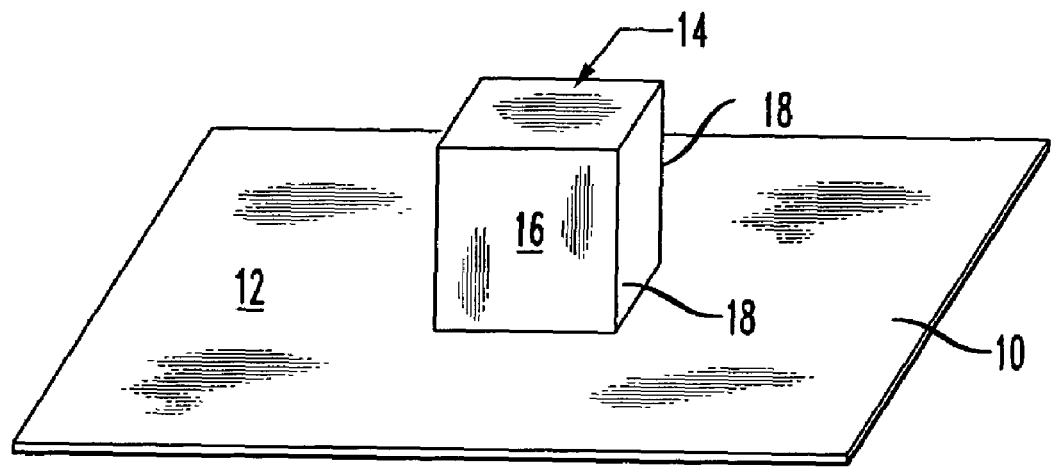
FIG. 3A is a perspective view showing an exemplary vertical structure formed over a horizontal substrate.
Figure 3B:
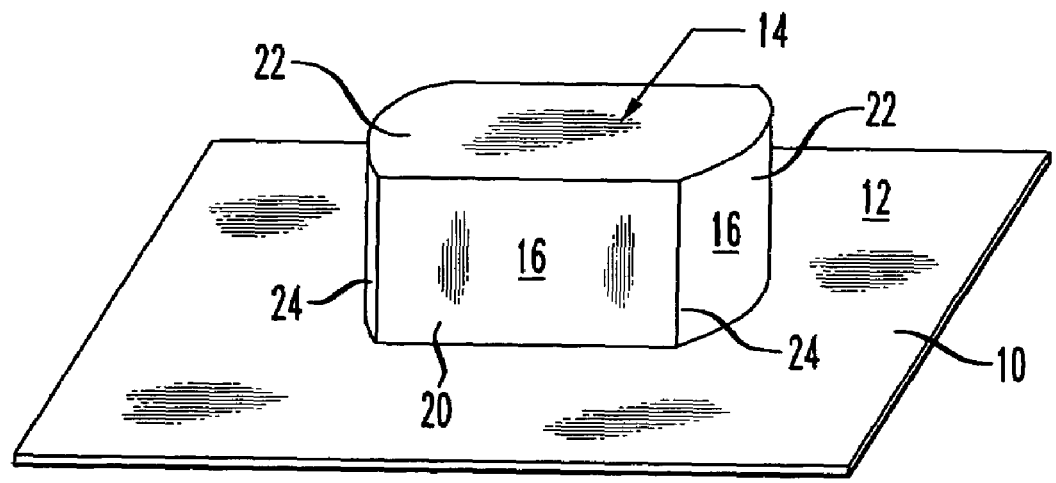
FIG. 3B is another perspective view showing an exemplary vertical structure formed over a horizontal substrate.

FIGS. 3A and 3B are perspective views showing exemplary semiconductor structures 14 including vertical surfaces 16, formed over generally horizontal substrate surface 12 of substrate 10. As stated above, like numerals denote like features throughout the specification and drawings. FIG. 3A includes vertical surface 16 including convex corners 18, and FIG. 3B illustrates vertical surface 16 including generally flat segments 20, curved sections 22 and convex corners 24 that form the junction between flat segments 20 and curved sections 22.

Figure 4A:
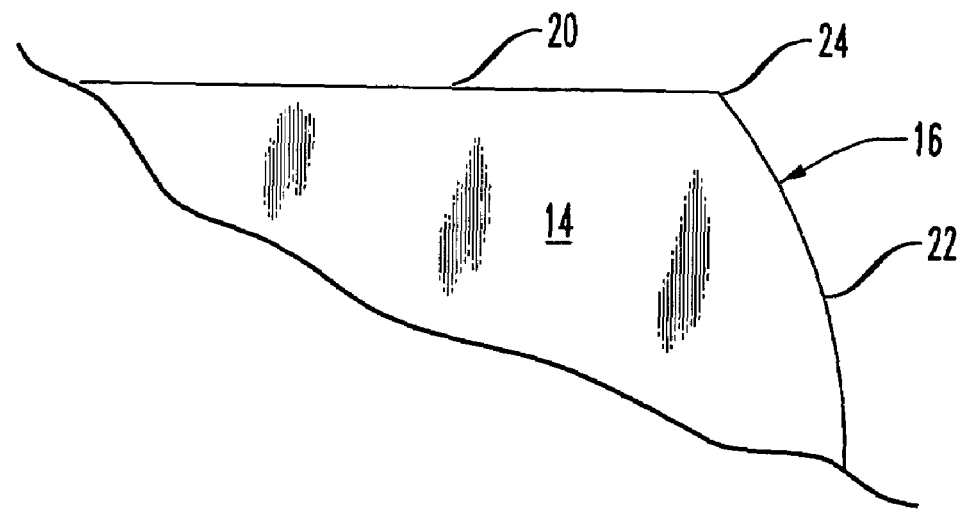
FIG. 4A is a cross-sectional top view of a structure including a vertical surface.

FIG. 4A is a cut-away portion of a top, cross-sectional view of semiconductor structure 14. In an exemplary embodiment, the plane of the cross-sectional view illustrated in FIG. 4A, may be a plane that is generally parallel to the substrate surface (not shown) over which semiconductor structure 14 is formed. Semiconductor structure 14 includes a relatively flat segment 20 of vertical surface 16 and a curved segment 22 of vertical surface 16 as well as convex corner 24 between the two segments.

Figure 4B:
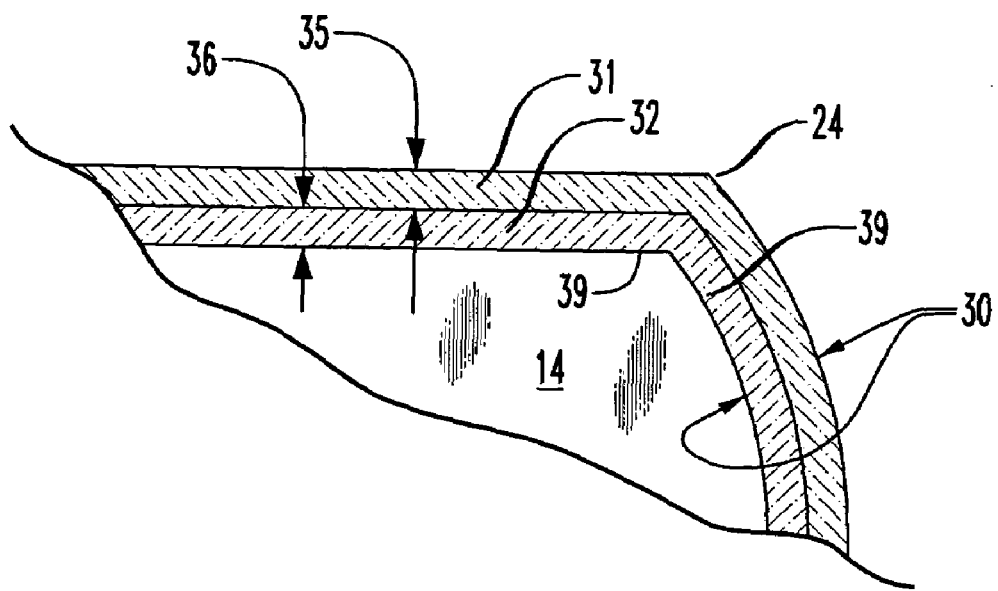
FIG. 4B shows the structure shown in FIG. 4A after an oxide layer has been formed on the surface according to the present invention.

One aspect of the present invention is a method for oxidizing the structure shown in FIG. 4A to produce the structure shown in FIG. 4B that includes a graded growth oxide layer 30 having first and second graded portions 31 and 32 with greatly reduced stress in the area adjacent the interface 39 formed between the oxide layer and the semiconductor structure 14 on which the oxide film is formed. The present invention provides for forming such a film on a surface which is both vertical, as previously described, and which is non-planar. The illustrated surface configuration shown in FIGS. 4A and 4B is intended to be exemplary, not restrictive of surfaces which may be oxidized according to the method of the present invention.

FIG. 4B is a cross-sectional cut-away view that shows the semiconductor structure of FIG. 4A after oxide layer 30, including first oxide portion 31 and second oxide portion 32, are formed according to the present invention. Semiconductor structure 14 may represent the channel of a vertical transistor and may be formed of silicon in one embodiment, but other semiconductor materials may be used according to other exemplary embodiments. Hereinafter, semiconductor structure 14 will be described according to the exemplary embodiment in which it is formed of silicon and in which thermally formed first oxide portion 31 and second oxide portion 32 are each silicon dioxide films. It should be understood, however, that the graded growth oxide principles described herein, may equally apply to other semiconductor materials in other exemplary embodiments.

Oxide layer 30 may be considered a graded growth oxide layer and may be formed using a two-step synthesis process, which includes growing an oxide film at a temperature above the viscoelastic temperature ($T_{ve}$) of the film, after a pre-grown low temperature $SiO_2$ layer has been formed by thermal oxidation at a temperature below the viscoelastic temperature of the film. The viscoelastic temperature of the film, in this case, the silicon dioxide film. Methods for forming such a graded oxide film are described in U.S. Pat. Nos. 6,492,312 and 6,541,394, the contents of each of which are hereby incorporated by reference for all purposes as if set forth in their entirety.

First oxide portion 31 is the first of the sequentially formed films and serves as the upper or outer film of the graded growth oxide embodiment. Second oxide portion 32 is sequentially formed second and forms the inner or lower portion of composite oxide layer 30. First oxide portion 31 is formed by upwardly ramping the temperature of the substrate on which semiconductor structure 14 is formed, to a relatively low temperature which is below the viscoelastic temperature of silicon dioxide which is approximately 925° C. in one embodiment, but may take on other values within the range of 900–950° C. in other exemplary embodiments. One aspect of the invention relates to the step of upwardly ramping the temperature at a relatively high ramping rate to reduce any oxide formed during the upward ramping. For example, the relatively high ramping rate may be greater than 35° C./minute, although much faster rates are also possible. In addition, the step of growing first oxide portion 31 may further comprise exposing the substrate to an oxidizing ambient containing a relatively small amount of oxygen during the upward ramping to alternately or additionally reduce any oxide formed during upward ramping. For example, the relatively small amount of oxygen may be less than about 10%, although even smaller percentages may also be used.

According to one exemplary embodiment, the temperature may be ramped up to and maintained at a first oxidation temperature within the range of 750–800° centigrade but other temperatures may be used in other exemplary embodiments. First oxide portion 31 is illustratively a silicon dioxide film formed during a thermal oxidation step which may include an ambient oxygen concentration of about 0.1% to about 10% with an ambient nitrogen concentration within the range of 90–99.9%. Dichloroethylene may optionally be added at 0–0.5%, but other ambient gas concentrations may be used in other exemplary embodiments. The thermal oxidation step includes heating at the first oxidation temperature for a time that is dependent upon the desired thickness as would be appreciated by one of ordinary skill in the art. After first oxide portion 31 is formed, an anneal in pure nitrogen may be carried out. In an exemplary embodiment, first oxide portion 31 may include a thickness of approximately 5–20 angstroms, but other thicknesses may be used according to other exemplary embodiments. Applicants theorize that the "pre-grown" first oxide portion 31 acts as a sink for stress relaxation that occurs during the subsequent growth of second oxide portion 31 under first oxide portion 31. First oxide portion 31 acts as a seed layer for the subsequently formed second oxide portion 32.

After the formation of first oxide portion 31 by heating at a relatively low temperature, is complete, a second, relatively high temperature oxidation step is carried out in an extremely diluted oxidizing ambient. The temperature is ramped up (i.e., the substrate is heated) relatively slowly, at an exemplary rate of 5–15° C. per minute although other rates may be used in other exemplary embodiments. The ambient concentration of oxygen during the formation of second oxide portion 32 may range from less than 0.1% $O_2$ to 5% $O_2$ with nitrogen comprising the balance of the ambient. Other ambient gas concentrations may be used in other exemplary embodiments. A second, relatively high oxidation temperature is achieved which is above the viscoelastic temperature. The second, high temperature thermal oxidation step may take place at a second oxidation temperature within the range of 940–1050° C. in one embodiment, but may lie within the range of 925–1100° C. according to other exemplary embodiments. The second, high temperature step includes heating at the second oxidation temperature for a time chosen to produce the desired film thickness, as would be appreciated by one of ordinary skill in the art. Applicants believe that the careful heating rate in a low oxygen ambient reduces growth stress and consequently reduces the occurrence of oxide growth defects such as slip dislocations and stacking faults, which curved segment 22 and convex corner 24 are especially susceptible to.

It is believed that second oxide portion 32 is relatively amorphous and thereby has little, if any, crystalline structure and short range order. Second oxide portion 32 is therefore a denser oxide than conventional $SiO_2$ oxides.

After second oxide portion 32 is formed at a temperature above the viscoelastic temperature, it is first cooled using a slow modulated cooling rate, then by a relatively fast cooling rate. In one embodiment, the slow cooling rate may be utilized until the viscoelastic temperature is achieved, then the more rapid cooling rate used. In one embodiment, a cooling rate of about 1–10° C. per minute, most preferably 2–5° C. per minute may be used during the first relatively slow cooling segment which may conclude at the viscoelastic temperature or another temperature below the viscoelastic temperature. According to an exemplary embodiment, the modulated relatively slow cooling may be carried out until a temperature between 800° C. and the viscoelastic temperature is achieved. After the first relatively slow cooling segment is concluded, a faster cooling rate, which may be within the range of 25–35° C. per minute, may be used. Such cooling rates are exemplary only and other relatively slow and relatively fast cooling rates may be used according to other exemplary embodiments. The gradual and modulated cooling generates a relatively strain free and smooth interface 39 between oxide layer 30 and the semiconductor material on which it is formed.

The thickness of second oxide portion 32 may range from 5–30 angstroms, most advantageously 5–15 angstroms, in an exemplary embodiment, but other thicknesses may be used in other exemplary embodiments. The thickness of second oxide portion 32 may represent 2–75% of the total thickness of oxide layer 30, which may range from 5 Å to greater than 100 Å, in one exemplary embodiment. Other thicknesses may be used in other exemplary embodiments.

A characteristic of the present invention is the smooth interface 39 formed between second oxide portion 32 and the semiconductor material on which it is formed. This smoothness may generally be measured in terms of the surface roughness of the interface. In the oxide of the present invention, interface 39 may include a surface roughness of approximately three angstroms or less. Conventional oxide films may have an interface roughness of 5 Å or greater. Moreover, interface 39 is substantially stress free, having 0 to $2\times10^9$ dynes/cm$^2$ of compression. This results in a defect density ($D_0$) on the order of 0.1 defects/cm$^2$ or less. Second oxide portion 32 is also believed to be a more dense layer of oxide in comparison to conventional oxides. As a result of the dense and substantially stress free characteristics of the graded growth oxide of the present invention, the interface trap density ($N_{it}$) of the oxide of the present invention is on the order of $5\times10^{10}$/cm$^2$ to $3\times10^9$/cm$^2$ or less. Interface 39 is therefore a relatively pristine, defect free silicon/oxide interface and advantageously may be used as a transistor gate dielectric and is particularly suited for use as transistor gate dielectrics for vertical transistors, which typically include curved surfaces such as curved segment 22 of vertical surface 16 and convex corners such as convex corners 24 and 18 (as shown in FIGS. 2 and 3A) of vertical surfaces 16.

The graded growth oxide film may be advantageously used as a gate dielectric for various semiconductor devices such as transistors including, but not limited to, vertical transistors and transistors having non-planar channels and which may be generally vertical or horizontal.

Although described above with respect to a silicon surface and a silicon dioxide film having a viscoelastic temperature of about 925° C., the graded growth oxide layer of the present invention may be formed on other materials (for example, silicon/germanium or silicon/germanium/carbon) that produce oxide films having different viscoelastic temperatures. As would be appreciated by one of ordinary skill in the art, the first and second oxidation temperatures, below and above the viscoelastic temperatures, respectively, are adjusted accordingly.

Figure 4C:
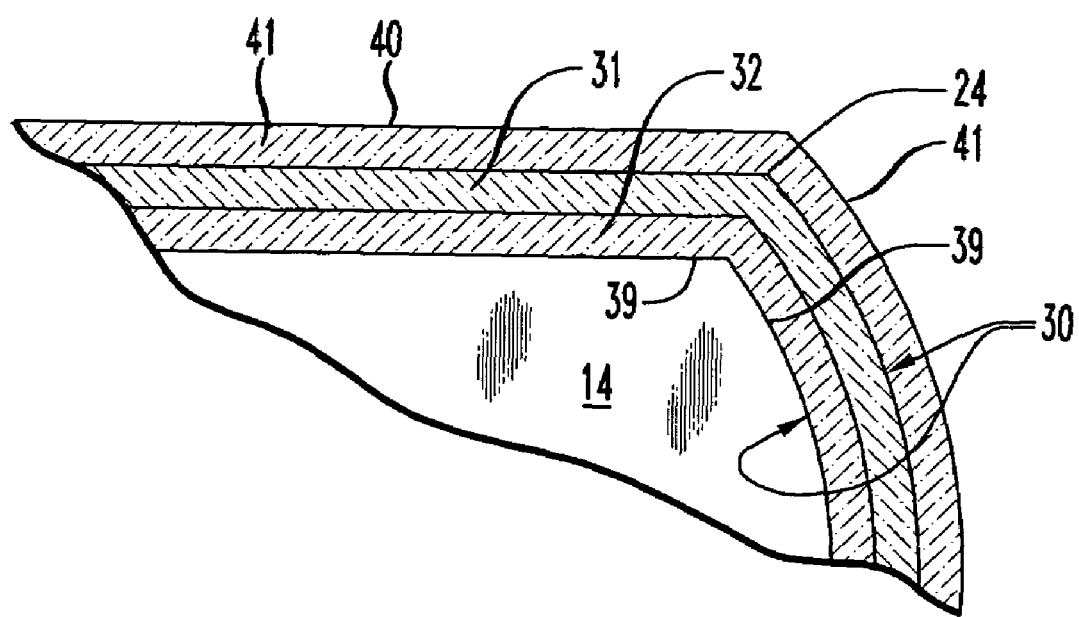
FIG. 4C shows the structure shown in FIG. 4B after a further dielectric layer has been formed over the oxide layer.

FIG. 4C is another exemplary embodiment showing further dielectric film 41 formed over surface 40 of oxide layer 30. Further dielectric film 41 may be silicon nitride or another suitable dielectric film capable of preventing boron penetration and boron diffusion through the gate oxide layer. Further dielectric film 41 may be formed using conventional methods such as by passing $N_2O$ or other nitrogen-rich gases such as ammonia, along surface 40 after oxide layer 30 has been formed. Other suitable and conventional methods for forming further dielectric film 41, may be used alternatively. Further dielectric film 41 may be any of various suitable dielectric films capable of suppressing boron diffusion. Further dielectric film 41 is an optional film and may not be used in various exemplary embodiments.

Figure 5A:
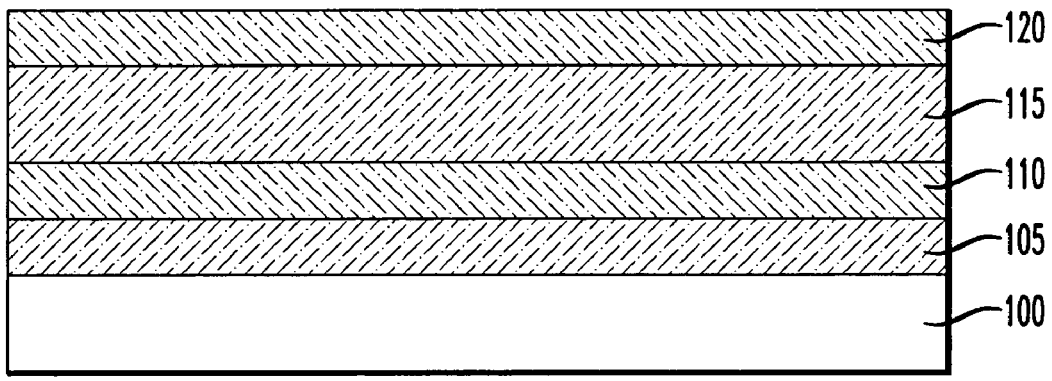
FIGS. 5A–5D illustrate the process sequence of one embodiment of the present invention.

Various process sequences may be used to form vertical transistors such as described in previously incorporated U.S. Pat. Nos. 6,027,975 and 6,197,641. FIGS. 5A–5D illustrate a process sequence for forming an exemplary vertical transistor. FIG. 5A is a cross-sectional view showing three layers of material 110, 115 and 120 formed over a heavily doped source region 105 formed within silicon substrate 100. Each of the layers may be formed using conventional methods such as chemical vapor deposition and sputtering. First layer 110 is an electrically insulating material such as $Si_3N_4$ and may serve to electrically isolate source region 105 from a subsequently formed overlying gate electrode (not shown). Second layer of material 115 is chosen to include a significantly different etch resistance to a selected etchant than the insulating material of first layer 110. Specifically, for the selected etchant, the etch rate of second layer 115 is chosen to be much higher than the etch rate of insulating material of the first layer 110. In this manner, second layer 115 can later be removed by etching without significantly affecting first layer 110. The thickness of second layer 115 is selected to define the physical gate length of the device. This is because second layer 115 is sacrificial, that is, it will be removed and the gate of the device will be formed in the space defined by this layer. Third layer of material 120 is formed over second layer 115 and is chosen to advantageously be an electrically insulating material. It is advantageous that the insulating material of third layer 120 have a significantly lower etch rate in the selected etchant than the material of second layer 115. It is advantageous that a relative etch rate of ten to one may be used. Each of layers 110 and 120 may include dopant impurities.

Figure 5B:
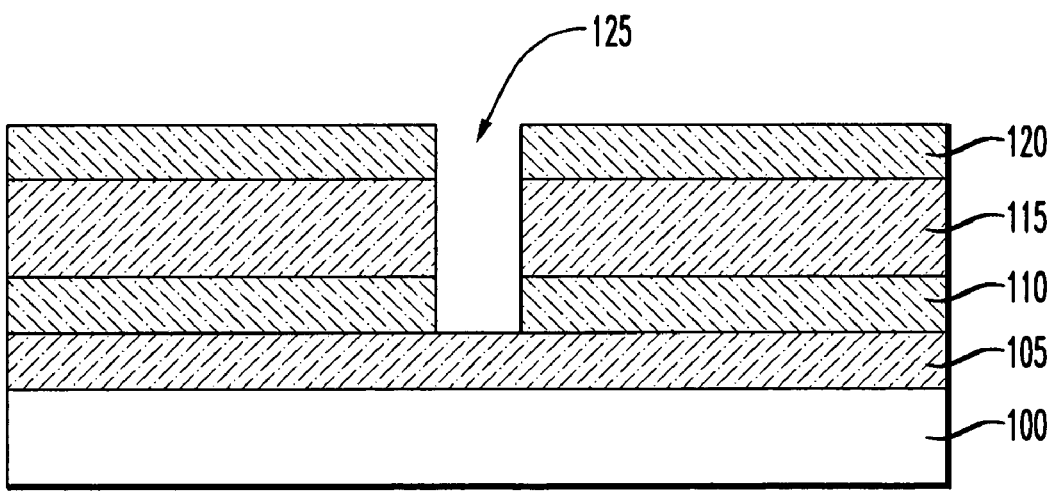

Now turning to FIG. 5B, opening 125 is formed to extend through the three layers 110, 115 and 120 and to terminate on heavily doped source region 105 which is a surface of silicon substrate 100. Conventional lithographic and etching techniques may be used to form opening 125. Opening 125 may alternatively be referred to as a window or trench.

Figure 5C:
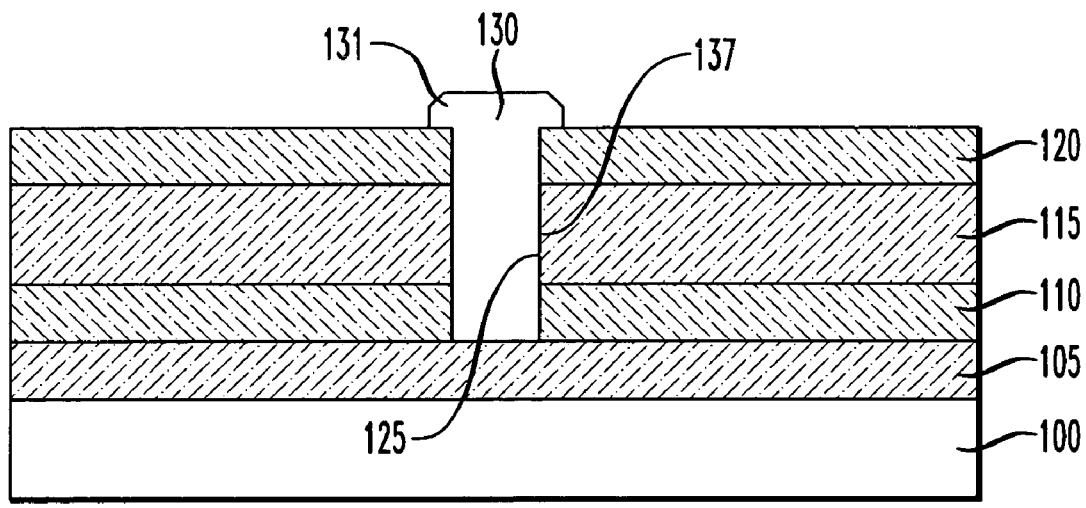

FIG. 5C shows semiconductor material 130 filling opening 125. In an exemplary embodiment, semiconductor material 130 may be a crystalline semiconductor material such as silicon/germanium or silicon/germanium/carbon, and in a preferred embodiment it may be a single crystalline semiconductor material such as silicon. Techniques for forming crystalline semiconductor materials in windows are well known to those skilled in the art. For example, semiconductor material 130 may be a crystalline material epitaxially formed in opening 125. In another embodiment, an amorphous layer of the semiconductor material is deposited on the surface of the substrate and all but semiconductor material 130 and extension 131 on the top of window 125 are removed. The amorphous semiconductor material may then be annealed to crystallize the material. Semiconductor material 130 may be considered a plug or a pillar. The plug or pillar has opposed ends and may include a cross-sectional shape that is substantially round, elliptical, or rectangular, or includes a cross-sectional plane that includes both curves and straight lines. Semiconductor material 130 may generally be considered to be semiconductor structure 14 having the various shapes previously described. Semiconductor material 130 includes vertical surfaces 137 which are substantially as described in conjunction with vertical surfaces 16 in previous figures.

At this stage, semiconductor material 130 may be doped to form the channel as well as the source and drain extension regions. A variety of ways to dope the plug of semiconductor material 130 are contemplated as suitable. In-situ doping of the semiconductor material as it is formed, or implantation of dopants into the semiconductor material after it is formed, are suitable expedients. In an exemplary embodiment, the source/drain extension regions may be formed by using layers 110 and 120 as sources of impurity species to dope semiconductor material 130, to form source and drain extension regions. Solid phase diffusion, in which an oxide or other dielectric supplies the dopant source, may be used. In this manner, the source/drain extension regions will be formed in portions of vertical surfaces 137 of semiconductor material 130 that are adjacent to corresponding layers 110 and 120.

After the exemplary structure shown in FIG. 5C is formed, an upper insulating layer 135 may be formed thereabove. Conventional patterning techniques may then be used to pattern upper insulating layer 135 and remove portions of upper insulating layer 135 and corresponding underlying portions of third layer 120. The removal of portions of third layer 120 exposes the material of second layer 115, which is chosen to have a significantly faster etch rate than the materials of first layer 110 and third layer 120. After portions of second layer 115 are exposed, a wet etching process or a process using an isotropic dry etching expedient, may be used to remove substantially all of second layer 115, thereby producing exposed vertical portion 145 of vertical surface 137. Second layer 115 is selectively removed with layers 110 and 120 remaining substantially intact. Vertical portion 145 may then have a transistor channel formed therein and may further have the exemplary graded gate oxide film of the present invention formed thereon to serve as a graded gate dielectric for a vertical transistor. Exposed vertical portion 145 may correspond to vertical surface 16 shown an d described previously and may therefore include curved surfaces, convex corners, or both. Semiconductor material 130 and therefore vertical portions 145 may be formed of various semiconductor materials, including, but not limited to, polycrystalline silicon.

Figure 5D:
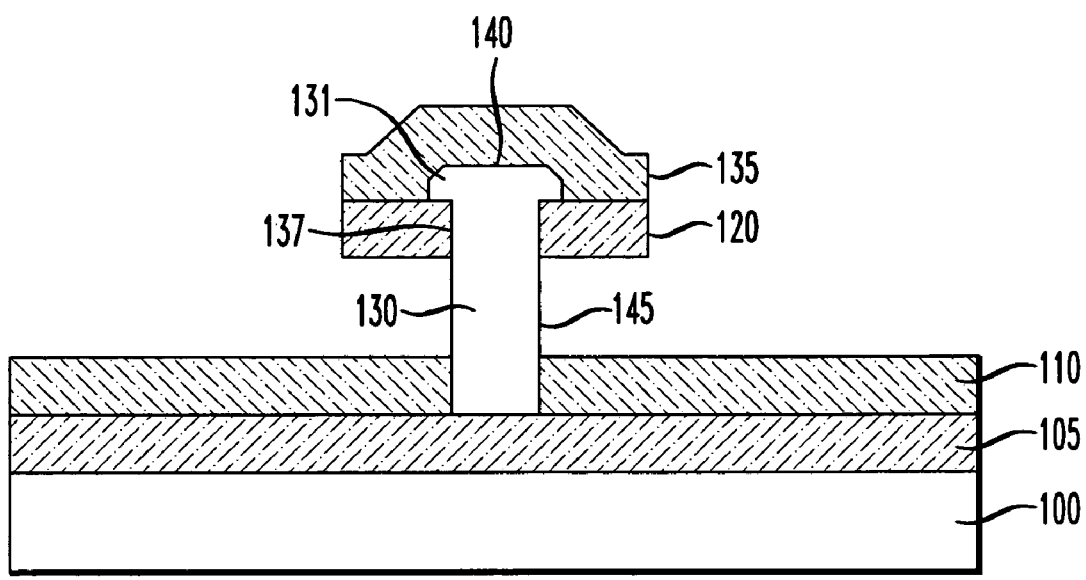

After the graded growth oxide layer 30 of the present invention (and optional further dielectric film 41) is formed on vertical portion 145, the exemplary structure shown in FIG. 5D may then have a suitable conformal material, such as polysilicon or other conductive or semiconductor materials, formed to contact the graded gate oxide film. This conformal material then serves as the gate electrode of the transistor. Various suitable processing steps may then be subsequently carried out to form electrical connections and/or isolate the vertical transistor as appropriate.

Various suitable techniques may be used to form source/drain regions and source/drain extension regions above and below the transistor channel formed within exposed vertical portion 145. The exemplary source/drain regions include source/drain regions formed both within and vertically adjacent semiconductor material 130. According to one exemplary embodiment, a further conductive film or doped semiconductor material may be formed between third layer 120 and upper dielectric layer 135 and in contact with semiconductor material 130 to form an upper source/drain region. Such an exemplary process sequence for forming a vertical transistor including a separately formed material serving as a source/drain region and including source/drain extension regions is described in reference to FIGS. 3A–3P of previously-incorporated U.S. Pat. No. 6,027,975.

The embodiments described above are provided to illustrate specific examples of processes that utilize the present invention. One skilled in the art will appreciate that there are many other process sequences, materials, and expedients that are useful for practicing the present invention. One skilled in the art will further appreciate that subsequent processing operations such as metalization and patterning, may be carried out to provide interconnection between the vertical transistors and other device components within the semiconductor device or integrated circuit.

Various other suitable process sequences may be used to form other vertical transistors, and other vertical silicon and other semiconductor surfaces, such as surfaces that include curved portions, convex corners, or both. The graded growth oxide process of the present invention may be advantageously applied to the various vertical silicon or other semiconductor surfaces. Similarly, the graded grown oxide of the present invention may equally be applied to other non-planar surfaces, such as surfaces which may be or which may contain components that are generally horizontal or parallel to the substrate surface. The illustrated surfaces and embodiments are therefore intended to be exemplary and not restrictive of the present invention.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A method for forming an oxide layer on a vertical semiconductor surface comprising:

providing a substrate having a horizontal substrate surface and a substantially vertical semiconductor surface formed over said horizontal substrate surface;

thermally oxidizing said vertical semiconductor surface thereby forming a first oxide film on said vertical semiconductor surface, said thermally oxidizing occurring at a first temperature below the viscoelastic temperature of said oxide film; and further thermally oxidizing said vertical semiconductor surface thereby forming a second oxide film on said vertical semiconductor surface, said further thermal oxidizing occurring at a second temperature above said viscoelastic temperature, said first oxide film and said second oxide film forming an oxide layer on said vertical semiconductor surface.

2. The method as in claim 1, in which said first temperature is within the range of 750–800° C.

3. The method as in claim 1, further comprising cooling after further thermally oxidizing, said cooling including a relatively slow cooling rate at temperatures above said viscoelastic temperature and a relatively fast cooling rate at temperatures below said viscoelastic temperature, said relatively slow cooling rate being no greater than 10° C./minute.

4. The method as in claim 1, in which said viscoelastic temperature is about 925° C.

5. The method as in claim 1, further comprising heating from said first temperature to said second temperature at a rate no greater than 15° C. per minute.

6. The method as in claim 1, wherein said vertical semiconductor surface comprises silicon and said first and second oxide films are silicon dioxide.

7. The method as in claim 1, in which said vertical semiconductor surface includes at least one of a convex corner and a curved section.

8. The method as in claim 1, in which said providing includes forming a plug of one silicon, silicon/germanium, and silicon/germanium/carbon, said plug including opposed ends and said vertical semiconductor surface being a surface of said plug.

9. The method as in claim 8, wherein said vertical semiconductor surface comprises a transistor channel and said oxide layer comprises a gate oxide.

10. The method as in claim 9, further comprising forming one of a source region and a drain region at one end of said plug, and the other of said source region and said drain region at the other end of said plug, and forming a polysilicon layer laterally contacting said gate oxide and forming a transistor gate.

11. The method as in claim 1, wherein said providing comprises providing a vertical silicon plug disposed over said horizontal surface, said vertical silicon plug including at least one generally flat vertical surface and at least one curved vertical surface forming a junction therewith.

12. The method as in claim 1, further comprising upwardly ramping to said first temperature at a rate greater than 35° C./minute to reduce any oxide formed during said upwardly ramping.

13. The method as in claim 1, wherein said substrate comprises a semiconductor and said providing includes:

forming a first device region selected from the group consisting of a source region and a drain region of a semiconductor device, in said horizontal substrate surface;

forming at least three layers of material over said first device region, wherein said second layer is interposed between said first and said third layers;

forming a window in said at least three layers of material, wherein said window terminates at said first device region in said horizontal substrate surface;

filling said window with a semiconductor material thereby forming a semiconductor plug, wherein said plug has a first end and a second end and wherein said first end is in contact with said first device region and said plug includes said vertical semiconductor surface;

forming a second device region selected from the group consisting of a source region and a drain region in said second end of said semiconductor plug wherein one of said first and second device regions is a source region and the other is a drain region;

removing a portion of said third layer, thereby exposing said second layer underlying the removed portion of said third layer; and removing said second layer thereby exposing said vertical semiconductor surface.

14. The method as in claim 1, in which said vertical semiconductor surface comprises a vertical silicon surface and said providing includes:

forming a plurality of films over said horizontal substrate surface, said plurality of films including a sacrificial layer and an upper layer over said sacrificial layer;

forming an opening through each of said layers, thereby exposing said horizontal substrate surface;

filling said opening with silicon;

removing portions of said upper layer; then removing said sacrificial layer thereby exposing said vertical silicon surface.

15. A method for forming an oxide layer on a non-planar surface comprising:

providing a non-planar silicon surface;

thermally oxidizing said non-planar silicon surface thereby forming a first oxide film thereon, said thermally oxidizing occurring at a first temperature below the viscoelastic temperature of said oxide film; and further thermally oxidizing said non-planar silicon surface thereby forming a second oxide film on said non-planar silicon surface, said further thermal oxidizing occurring at a second temperature above said viscoelastic temperature, said first oxide film and said second oxide film forming a non-planar oxide layer on said non-planar silicon surface.

16. The method as in claim 15, in which said non-planar silicon surface includes at least one of a convex corner and a curved section.

17. The method as in claim 15, in which said first temperature is within the range of 750–800° C. and further comprising upwardly ramping to said first temperature at a rate greater than 35° C./minute to reduce any oxide formed during said upwardly ramping.

18. The method as in claim 15, further comprising cooling after further thermally oxidizing, said cooling including a relatively slow cooling rate at temperatures above said viscoelastic temperature and a relatively fast cooling rate at temperatures below said viscoelastic temperature, said relatively slow cooling rate being no greater than 10° C./minute.

19. The method as in claim 15, in which said viscoelastic temperature is about 925° C., and further comprising heating from said first temperature to said second temperature at a rate no greater than 15° C. per minute.

* * * * *